United States Patent [19]

Yamamoto et al.

[11] Patent Number: 5,111,237
[45] Date of Patent: May 5, 1992

[54] IMAGE FORMING APPARATUS

[75] Inventors: Takemi Yamamoto; Jun Sakai, both of Nagoya; Hiroshi Kawahara, Aichi; Shigeyuki Hayashi, Nagoya; Kenji Sakakibara, Ichinomiya; Michitoshi Akao, Nagoya; Ichiro Sasaki, Nagoya; Ryohei Komiya, Nagoya, all of Japan

[73] Assignee: Brother Kogyo Kabushiki Kaisha, Nagoya, Japan

[21] Appl. No.: 24,432

[22] Filed: Mar. 11, 1987

[30] Foreign Application Priority Data

Mar. 11, 1986 [JP] Japan ................. 61-51408
Mar. 31, 1986 [JP] Japan ................. 61-73952

[51] Int. Cl.$^5$ .................... G03B 27/32; G03B 27/52
[52] U.S. Cl. .......................... 355/27; 355/78; 355/63; 355/106; 430/138
[58] Field of Search ............... 355/27, 78, 79, 63, 355/104, 106; 430/138

[56] References Cited

U.S. PATENT DOCUMENTS

| | | | |
|---|---|---|---|
| 2,344,558 | 3/1944 | Moore | 355/63 |
| 2,918,857 | 12/1959 | Frantz | 355/106 |
| 3,472,592 | 10/1969 | Nichols et al. | 355/104 |
| 4,399,209 | 11/1981 | Sanders et al. | 430/138 |
| 4,416,966 | 8/1982 | Sanders et al. | 430/138 |
| 4,440,846 | 11/1981 | Sanders et al. | 430/128 |
| 4,448,516 | 5/1984 | Arney et al. | 355/27 |
| 4,535,050 | 7/1983 | Adair et al. | 430/138 |
| 4,536,463 | 12/1983 | Sanders | 430/138 |
| 4,624,560 | 11/1986 | Beery | 355/27 |
| 4,842,981 | 5/1984 | Sanders et al. | 430/138 |

FOREIGN PATENT DOCUMENTS

| | | |
|---|---|---|
| 8216938 | 10/1982 | France . |
| 2111232A | 6/1983 | United Kingdom . |
| 2172173A | 9/1986 | United Kingdom . |

*Primary Examiner*—Monroe H. Hayes
*Attorney, Agent, or Firm*—Jones, Tullar & Cooper

[57] ABSTRACT

A light-and pressure-sensitive recording sheet and an original, overlapping each other, are introduced into an image forming apparatus, and are exposed to radiation on a transparent drum by means of a light source in the drum, whereupon a latent image, based on the contents of the original, is formed on the recording sheet. Then, the recording sheet is separated from the original by means of a separator, and is passed between a pair of pressure rolls. When the recording sheet is exposed, microcapsules thereon change their hardness. These microcapsules are ruptured selectively by pressure applied to the sheet. As a result, a chromogenic material, contained in the microcapsules, and a developer material, on the surface of a substrate of the recording sheet, react with each other, so that the sheet surface changes its color. Thus, the latent image is developed to accomplish copying in accordance with the original.

4 Claims, 6 Drawing Sheets

IMAGE FORMING APPARATUS

CROSS REFERENCE TO OTHER APPLICATION

Reference is made to copending application Ser. No. 943,195.

BACKGROUND OF THE INVENTION

The present invention relates to image forming apparatuses for printers, copying machines, etc., which form an image by irradiation with light carrying image information or by transmitting radiation through the original, and more particularly to image forming apparatuses for developing a latent image by pressurizing a light- and pressure-sensitive recording sheet on which the latent image is formed by exposure.

As conventional apparatuses of this type, using photosensitive recording sheets, there are diazo copying machines and systems utilizing the photographic developing process. In either case, some special chemicals must be provided exclusively for processes of developing and fixing a latent image which is formed on a photosensitive recording sheet by exposure. Such chemicals, which cannot be very easy to handle, entail various problems on the operation and maintenance of the apparatus.

As disclosed in U.S. Pat. Nos. 4,399,209 and 4,440,846, light- and pressure-sensitive recording sheets have been developed, as novel recording sheets, which obviate the aforesaid problems, and permit image formation without the use of chemicals. These sheets are recording media in which a layer of microcapsules and a layer of developer material are formed on a substrate. The microcapsules contain a chromogenic material such that their hardness varies according to the degree of exposure.

In image forming operation, the light- and pressure-sensitive recording sheet is exposed in accordance with the contents of the original to be copied, whereupon a latent image is formed on the sheet. Then, the microcapsules on the recording sheet are ruptured selectively, by means of a pressure roll, in accordance with their changed hardness. Thereupon, the chromogenic material and the developer material in the capsules react with each other, thereby developing a color image.

With use of the light- and pressure-sensitive recording sheet constructed in the aforesaid manner, the developing process does not require use of chemicals. Thus, there is a demand for the development of a compact image forming apparatus using such a recording sheet, as well as light- and pressure-sensitive recording sheets of a novel structure.

The pressure roll, which is used in the developing process, has the following problem. The chromogenic material from the ruptured microcapsules adheres to the roll, and soils the recording surface of the recording sheet when the roll pressurizes the sheet in the subsequent process, thereby lowering the quality of the image obtained.

In FIG. 4, upper and lower pressure roll 1 and 2 rotate individually in the directions indicated by arrows 3. A light- and pressure-sensitive recording sheet 4 is fed between the rolls 1 and 2, in the direction of the arrow. Before it is delivered to the rolls 1 and 2, the recording sheet 4 is formed with a latent image, at a latent-image forming section (not shown). Then, the sheet 4 is pressurized between the rolls 1 and 2, whereupon the microcapsules on the sheet 4 are ruptured according to their hardness As a result, the chromogenic material from the capsules reacts with the developer material, thereby developing a color image, varied in density, on the recording sheet.

In this case, part of the developed coloring material adheres to that pressure roll which faces the recording surface, thus causing the aforementioned problem.

In order to remove the coloring material adhering to the pressure roll, a conventional pressure roll mechanism is constructed as shown in FIG. 5 or 6. In FIG. 5, a roll cleaner 6 is disposed in contact with the surface of the pressure roll 1. The cleaner 6 is composed of a small roll and a felt member wound thereon. The felt member serves to wipe the surface of the pressure roll 1. Since the felt itself soils, it must be replaced or maintained as required or periodically. A conveyor mechanism 7 is used to transport the recording sheet 4.

In FIG. 6, a felt cleaner 8, a pawl 9, and a receiver 10 are arranged in contact with the surface of the pressure roll 1. The cleaner 8 wipes the surface of the roll 1, the pawl scrapes residual matter from the roll surface, and the receiver 10 receives the scraped matter. This conventional pressure roll mechanism requires cleaning of the receiver 10, as well as replacement and maintenance of the cleaner 8.

SUMMARY OF THE INVENTION

An object of the present invention is to provide a novel image forming apparatus, which has a simple construction, and is easy to operate and maintain, and a light- and pressure-sensitive recording medium adapted for use in the apparatus.

In order to achieve the above object, an image forming apparatus according to the present invention comprises a light- and pressure-sensitive recording medium including a sheetlike substrate, a number of microcapsules provided on the surface of the substrate and containing a first composition and a photosensitive composition, and a second composition, the photosensitive composition reacting with radiation, thereby changing the mechanical rupture strength of the microcapsules, the second composition reacting with the first composition, thereby changing the color of the surface of the substrate; exposure means for applying radiation through an original to the light- and pressure-sensitive recording medium; and pressurizing means for pressurizing the light- and pressure-sensitive recording medium so that the microcapsules are ruptured selectively in accordance with the mechanical rupture strength thereof, changed by the exposure by the exposure means, thereby allowing the first and second compositions to react with each other.

In the arrangement described above, the light- and pressure-sensitive recording medium or sheet is exposed to radiation from the exposure means, through the original which have characters, patterns, etc., thereon. Thereupon, the microcapsules, carried on the surface of the recording sheet, change their mechanical rupture strength, that is, they harden or soften. Then, the pressurizing means ruptures those microcapsules on the exposed recording sheet which have a lower rupture strength, that is, those softened or unhardened by the irradiation. As a result, the first composition from the ruptured microcapsules reacts with the second composition on the surface of the sheetlike substrate, thereby changing the color of the substrate surface. Thus, those regions of the light- and pressure-sensitive recording medium which are exposed or unexposed to radiation, depending on the image on the original, change color, thereby accomplishing an original-copying operation.

In the copying apparatus of the transmitted-light type, according to the present invention, no chemicals are used in developing or fixing an image on the exposed recording sheet. Therefore, the apparatus of the invention, as compared with the prior art apparatus of this type, can enjoy easier operation and maintenance, as well as a simpler construction, lower costs, and more compact design.

Another object of the present invention is to provide an image forming apparatus which uses a light- and pressure-sensitive recording sheet, and in which a pressure roll mechanism is improved so that a coloring material is prevented from adhering to a pressure roll during developing operation.

In order to achieve the above object, an image forming apparatus of the present invention is constructed so that an auxiliary sheet, formed of a paper sheet or transparent laminate sheet, is fed between a pressure roll and a recording sheet, at a pressure roll mechanism section, whereby the recording sheet is prevented from coming directly into contact with the roll.

Thus, according to the image forming apparatus of the present invention, using the light- and pressure-sensitive recording sheet, the coloring material cannot adhere to the surface of the pressure roll, and the roll surface need not, therefore, be cleaned particularly.

Since the auxiliary sheet is interposed between the pressure roll and the recording surface of the light- and pressure-sensitive recording sheet, moreover, the pressurizing force of the pressure roll, on the microcapsules on the surface of the recording sheet, can be made uniform.

Furthermore, if a transparent laminate film having an ultraviolet-absorption effect is used as the auxiliary sheet, the recording surface can be prevented from fading, despite an exposure to radiation, especially, ultraviolet rays.

DETAILED DESCRIPTION OF THE PREFERRED EMBODIMENTS

Figure 1:
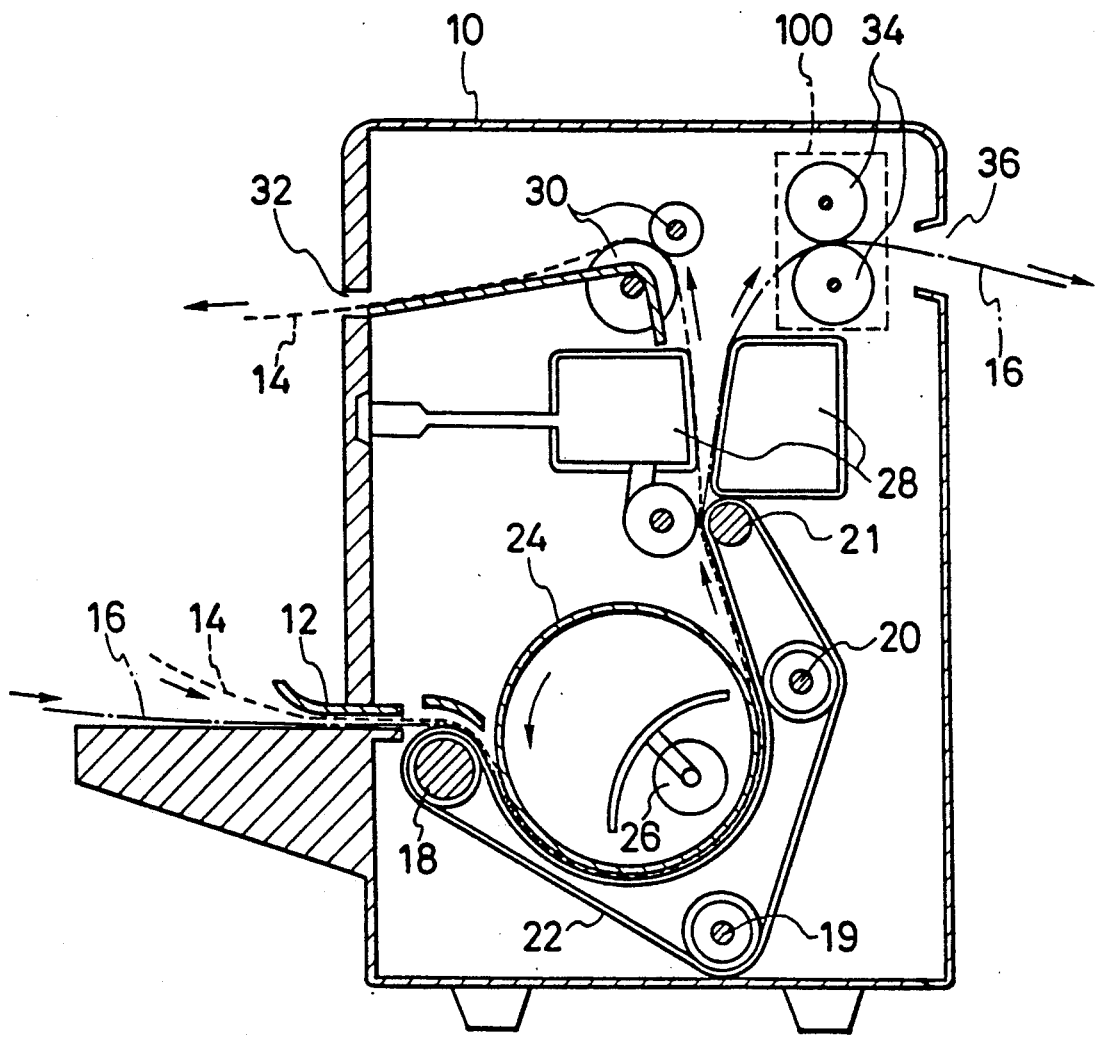
FIG. 1 is a vertical sectional view of an image forming apparatus according to a first embodiment of the present invention.

A copying machine, as an image forming apparatus according to a first embodiment of the present invention, will be described which replaces conventional diazo copying machines. In this copying machine, an original and a photosensitive sheet are brought into intimate contact with each other for full-size copying. FIG. 1 is a vertical sectional view showing an outline of the copying machine. An original 14 and a light- and pressure-sensitive recording sheet 16, the former on the latter, are inserted into the copying machine through a sheet inlet slot 12, which is bored through the lower portion of a casing 10. The two sheets of paper are fed between an endless belt 22 and a transparent cylindrical drum 24. The belt 22, which is passed around four rolls 18, 19, 20 and 21, constitutes conveyor means. While the drum 24 makes a substantially half turn in the counterclockwise direction, as indicated by the arrow, the recording sheet 16 is exposed to light from a light source 26 located in the drum 24. The drum 24 and the light source 26 constitute exposure means. Alternatively, rotatable light source means, such as a fluorescent lamp, may be used for the drum 24. After the exposure process, the original 14 and the recording sheet 16 are separated from each other by a separator 28, and the original 14 is discharged through an original return slot 32 by means of a pair of exit rolls 30. The recording sheet 16 is subjected to a pressure by a pair of pressure rolls 34 as pressurizing means, which constitutes a pressure roll mechanism 100, and is then discharged through a copy discharge slot 36.

There will now be described the light- and pressure-sensitive recording sheet 16, used in the aforementioned copying machine, and processes of developing and fixing the sheet 16. The recording sheet 16 may have various structures, as shown in FIGS. 2(A) to 2(H). Basically, however, the sheet 16 is formed of a sheetlike substrate, a number of microcapsules provided on the surface of the substrate, and a second composition. The microcapsules contain a first composition and a photosensitive composition, which reacts with radiation, thereby changing the mechanical rupture strength of the microcapsules. The second composition reacts with the first composition, thereby changing the color of the surface of the substrate. There are light- and pressure-sensitive recording sheets in which the substrate, the first composition in the microcapsules, and the second composition on the substrate are combined as follows.

Figure 2A:
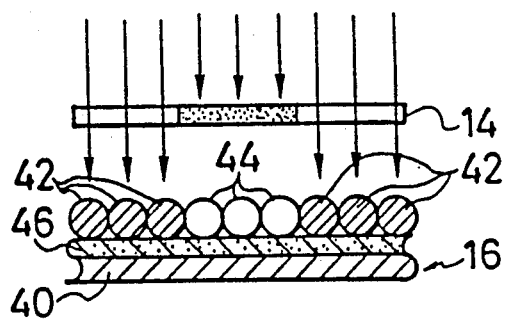
FIGS. 2(A), 2(B), 2(C), 2(D), 2(E), 2(F), 2(G), and 2(H) are cross-section schematically showing light- and pressure-sensitive recording media of various configurations, applied to the image forming apparatus of the invention.
Figure 2B:
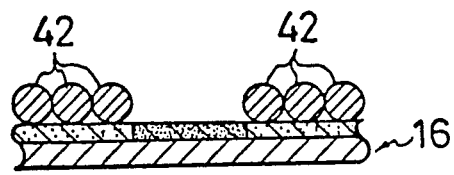

In an arrangement shown in FIG. 2(A) and 2(B), a paper sheet 40 is used as the sheetlike substrate, and the main ingredients contained in the microcapsules include a chromogenic material as the first composition, such as a triarylmethane compound, a radiation-curable resin as the photosensitive composition, such as trimethylpropane or other photopolymer, and a photopolymerization initiator, such as benzophenone. As the second composition carried on the paper sheet 40, a developer material, such as an organic acid, is used which reacts with the chromogenic material to effect color development. In this case, irradiated microcapsules 42 on the recording sheet 16 harden, while unirradiated microcapsules 44 remain soft, as shown in FIG. 2(A). If pressure is applied to the microcapsules on the sheet 16, by means of the paired pressure rolls 34 (FIG. 1), only the soft microcapsules 44 are ruptured. As a result, the chromogenic material, as the first composition, in the microcapsules 44 reacts with a developer material 46, as the second composition, applied to the sheet 40, thereby forming a copy image of the same phase as the original 14, on the sheet 40. Since the microcapsules 42, once hardened, cannot be ruptured afterward, the developed image can be fixed.

Figure 2C:
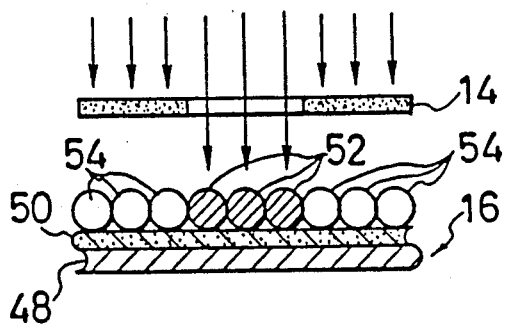
Figure 2D:
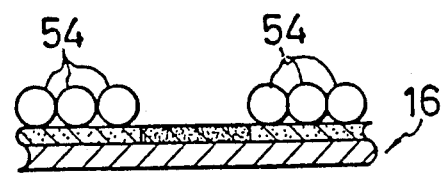

In a light- and pressure-sensitive recording sheet shown in FIGS. 2(C) and 2(D), a transparent film 48 is used as the sheetlike substrate, and a chromogenic material, as the first composition, and a photoplastic resin as the photosensitive composition, such as 3-oxyamino-2-methacrylate, are sealed in the microcapsules. Also, a developer material 50, as the second composition, is applied to the film 48. In this case, only irradiated microcapsules 52 soften, while unirradiated microcapsules 54 remain hard. When the microcapsules are pressurized thereafter by the pressure rolls 34, therefore, only the softened microcapsules 52 are ruptured, so that only those regions of the film 48 corresponding to the microcapsules 52 are colored. In this case, the copy image obtained is of the opposite phase to the original 14. Thus, the film can enjoy a negative-position conversion.

Figure 2E:
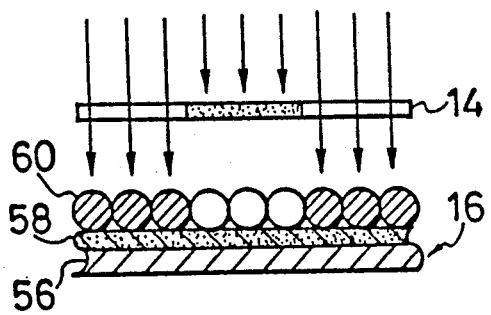
Figure 2F:

An arrangement shown in FIGS. 2(E) and 2(F) is substantially the same as the one shown in FIGS. 2(A) and 2(B). In this third arrangement, however, a coloring material 58 is previously applied, as the second composition, to a paper sheet 56, instead of using the developer agent. Microcapsules 60 contains a decoloring material, such as a bleaching agent, as the first composition, in place of the chromogenic material. In this case, only unirradiated microcapsules are decolored, so that a copy image is obtained which is of the opposite phase to the original 14.

Figure 2G:
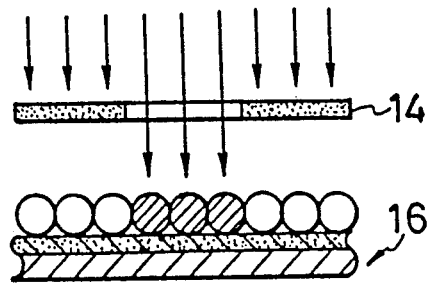
Figure 2H:
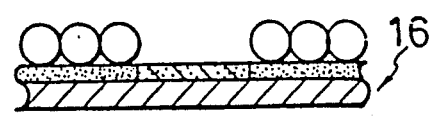

In an arrangement shown in FIGS. 2(G) and 2(H), as in the arrangement of FIGS. 2(E) and 2(F), a decoloring material and a coloring material are used, respectively, in place of the chromogenic material as the first composition, and the developer material as the second composition, which are used in the arrangement of FIGS. 2(C) and 2(D). In this case, the copy image obtained is of the same phase as the original 14.

According to the copying machine of this embodiment, as described above, copy image of the same or opposite phase can be obtained with use of various light- and pressure-sensitive recording sheets 16, depending on the applications. Since no chemicals are used in the copying operation, maintenance work for the resupply of chemicals is unnecessary. Thus, the apparatus is easier to operate.

Figure 3:
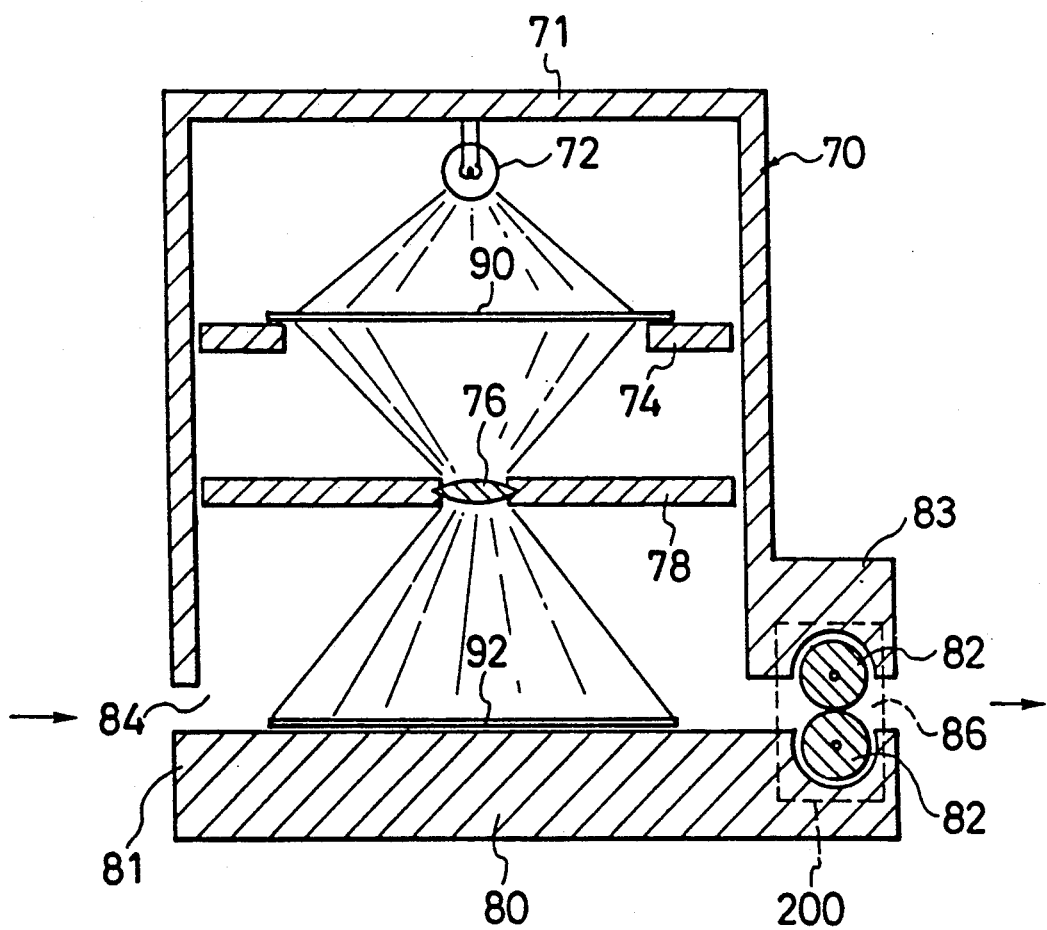
FIG. 3 is a vertical sectional view of an image forming according to a second embodiment of the invention.

Referring now to FIG. 3, a compact copying apparatus, as an image forming apparatus according to a second embodiment of the present invention, will be described. FIG. 3 is a vertical sectional view showing an outline of the apparatus. This apparatus comprises a casing 70 which includes a first portion 71 supporting a light source 72, a second portion or original table 74 thereunder, and a third portion or lens holder 78 underlying the table 74 and supporting a lens 76 in its center. The casing 70 further includes a fourth portion or recording sheet table 80 under the lens holder 78, a fifth portion 81 adjoining one end of the table 80 and having an opening 84 through which a light- and pressure-sensitive recording sheet 92 is put onto the table 80, in the direction indicated by the arrow of FIG. 3, and a sixth portion 83 formed at the other end of the table 80 and supporting a pair of pressure rolls 82. Defined around the pressure rolls 82 is an opening 86, through which the recording sheet 92 is discharged to the outside, in the direction of the arrow. The original table 74 and the lens holder 78 are designed so that they can be moved vertically by external operation. The paired pressure rolls 82 serve as pressurizing means, which constitutes a pressurizing mechanism 200.

The compact copying apparatus of this embodiment is operated as follows. First, a transparent or translucent original 90 is placed on the original table 74, and the light source 72 is turned on. Then, the original table 74 and the lens holder 78 are adjusted in height so that an original image of a desired size can be focused on the recording sheet table 80. Thereafter, the light- and pressure-sensitive recording sheet 92 is put on the table 80, where it is exposed to radiation for a predetermined period of time. The exposed recording sheet 92 is fed immediately sideways from the table 80, whereupon it is pressurized by the pressure rolls 82, for development and fixation.

The compact copying apparatus of the second embodiment can also use the various light- and pressure-sensitive recording sheets described in connection with the first embodiment. Besides, the apparatus can provide copy images of any desired magnification. The recording sheet 92, pressurized by the pressure rolls 82, can thereafter be used as a copy which is immune to both radiation and pressure.

Figure 6:
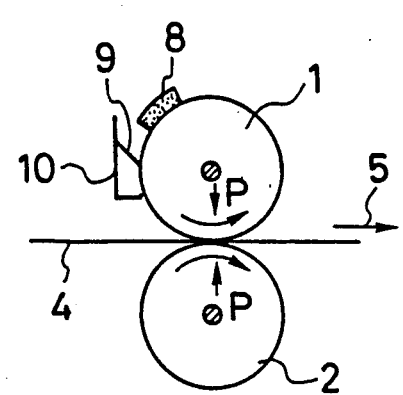
Figure 7:
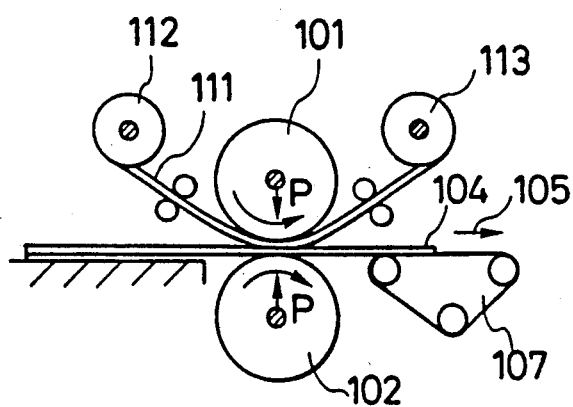
FIGS. 7 and 8 show improved arrangements of pressure roll mechanisms of image forming apparatuses according to third and fourth embodiments of the invention, respectively.
Figure 8:
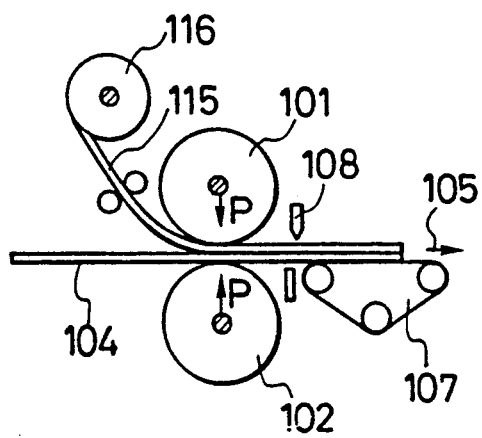
Figure 9:
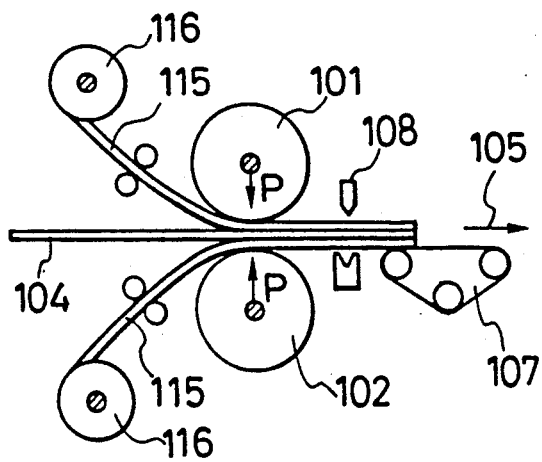
FIGS. 9 and 10 show modifications of the fourth embodiment of FIG. 8.
Figure 10:
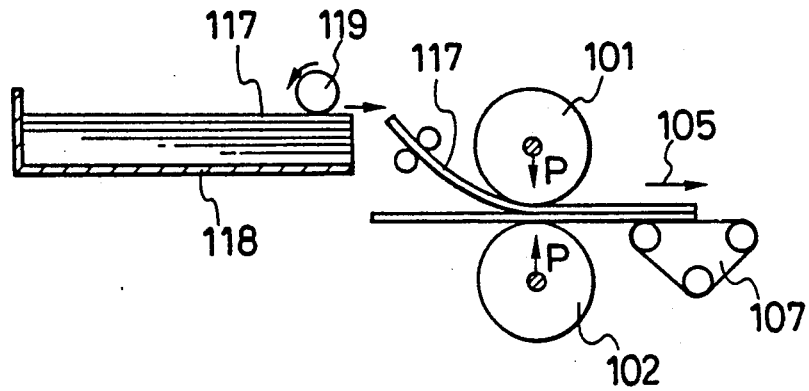
Figure 11:
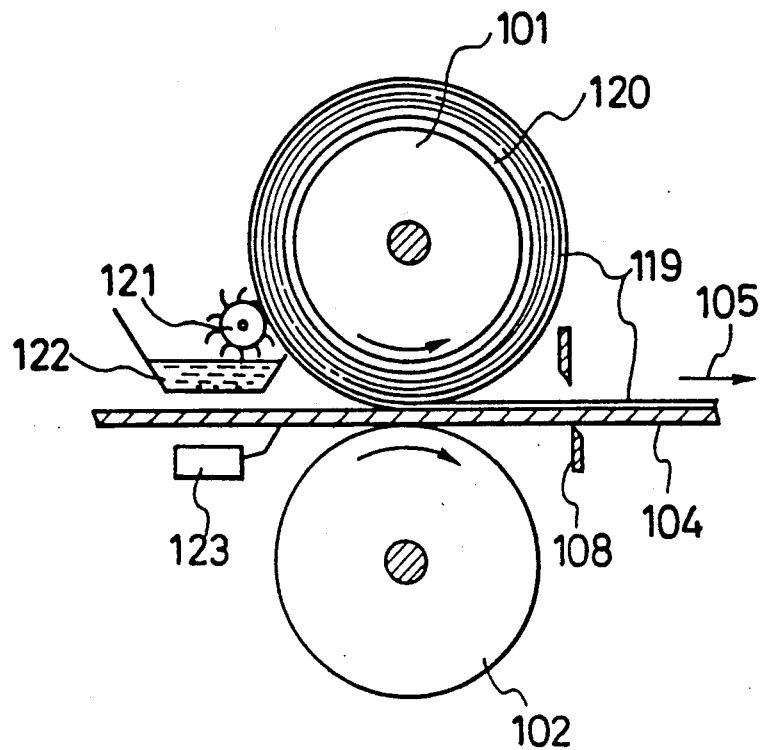
FIG. 11 shows a pressure roll mechanism of an image forming apparatus according to a fifth embodiment of the invention.
Figure 12:
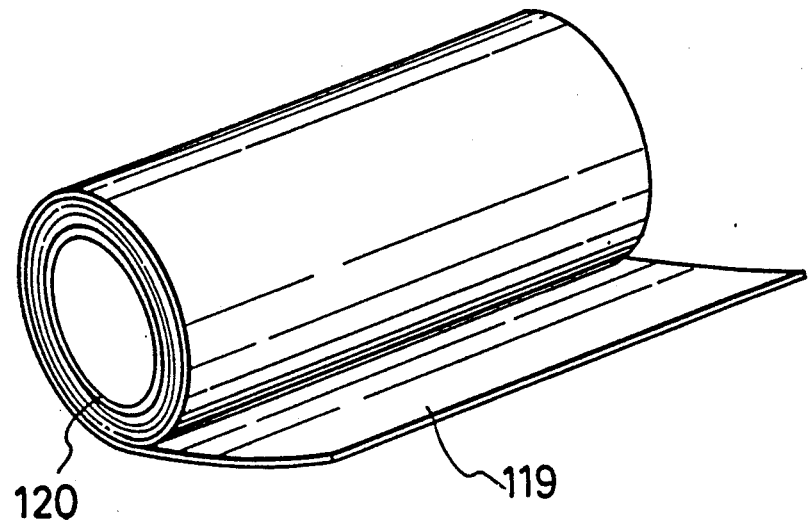
FIG. 12 is a perspective view showing a rolled auxiliary sheet, along with a plastic pipe, shown in FIG. 11.

FIGS. 7 to 12 show improved arrangements of pressure roll mechanisms, which eliminate the drawbacks of the prior art arrangements due to the direct contact between the pressure rolls and the light- and pressure-sensitive recording sheet, as described with reference to FIGS. 4 to 6. FIGS. 7 and 8 show third and fourth embodiments of the present invention, respectively, and FIGS. 9 and 10 show different modifications of the fourth embodiment. FIGS. 11 and 12 show a fifth embodiment of the invention.

The arrangements of these embodiments and modifications can be applied to the pressure roll mechanisms 100 and 200 of the first and second embodiments, shown in FIGS. 1 and 3, respectively.

Figure 4:
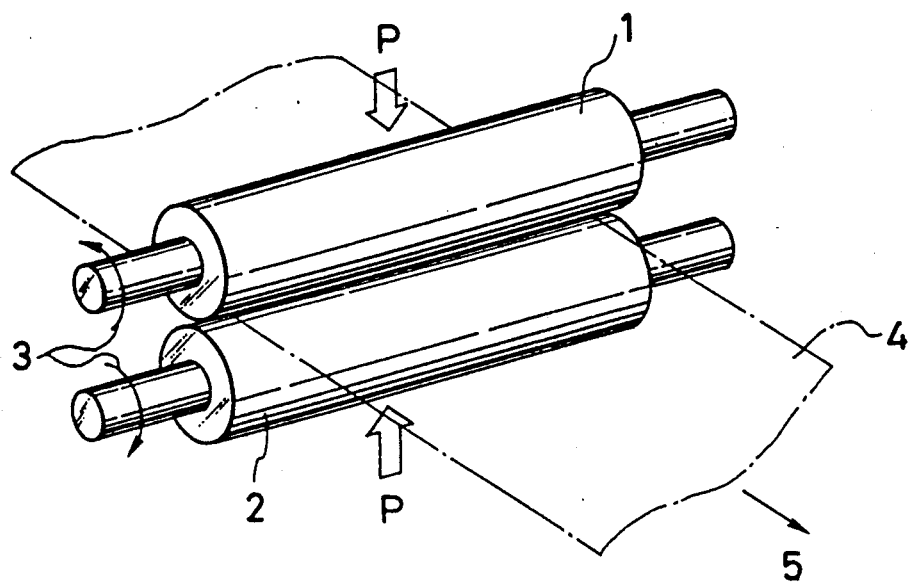
FIGS. 4, 5 and 6 are diagrams for illustrating the arrangement of a pressure roll mechanism of a prior art image forming apparatus.
Figure 5:
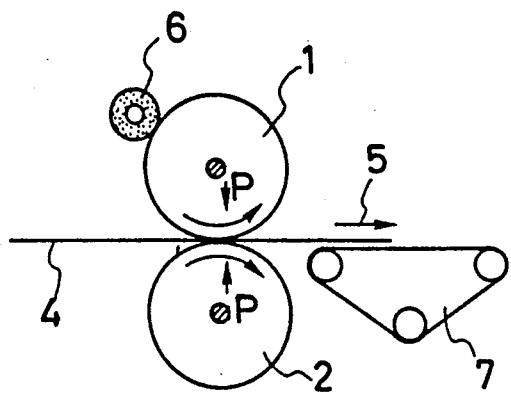

These portions of the arrangements shown in FIGS. 7 to 12 which have their counterparts in the arrangements of FIGS. 4 to 6 are designated by reference numerals of values equivalent to the sum of 100 and the values of their corresponding numerals used in FIGS. 4 to 6.

In the third embodiment shown in FIG. 7, a feed roll 112 is disposed on the left of an upper pressure roll 101, whereby an auxiliary sheet 111, in the form of an elongate belt, is fed in association with the movement of a light- and pressure-sensitive recording sheet 104. The auxiliary sheet 111, fed in this manner, is wound up by means of a recovery roll 113. In this case, the auxiliary sheet 111 is intended to adsorb a coloring material developed on a recording surface of the recording sheet 104. Therefore, high-adsorption paper may be used effectively for the sheet 111.

Thus, the recording sheet 104 can be prevented from coming directly into contact with the pressure roll 101. When the sheet 104 is pressurized under a pressure P by both pressure rolls 101 and 102, therefore, the coloring material, developed by the rupture of the microcapsules, is all adsorbed by the auxiliary sheet 104, without adhering to the pressure roll 101. Accordingly, the next recording sheet 104 to be delivered to the rolls can be prevented positively from being soiled by the coloring material.

If the recording sheet 104 has the recording surface on each side thereof, the auxiliary sheet 111 must naturally be fed on both upper and lower sides of the sheet 104.

In the fourth embodiment shown in FIG. 8, a feed roll 116 is used to feed a transparent laminate sheet 115, in the form of an elongate belt, as the auxiliary sheet. In this case, the material of the auxiliary sheet 115 should suitably be transparent and have an ultraviolet shielding effect. As the sheet 115 is fed pressurized between the pressure rolls 101 and 102 under the pressure P, as shown in FIG. 8, it is bonded to the recording surface of the light- and pressure-sensitive recording sheet 104, by means of a bonding agent on the back of the sheet 115. Therefore, the recovery roll need not be disposed on the right of the pressure roll 101. After the leading and trailing ends of the auxiliary sheet 115 are aligned with those of the recording sheet 104, the two sheets are cut by means of a cutter 108. The cutter 108 is located on the delivery side or the opposite side of the pressure roll 101 to the feed roll 116.

FIG. 9 shows a modified example such that the arrangement of FIG. 8 is used with the light- and pressure-sensitive recording sheet 104 which has the recording surface on each side thereof. Since both sides of the recording sheet 104 are recording surfaces, the coloring material on the sheet 104 may possibly adhere also to the lower pressure roll 102. In order to prevent this, the transparent laminate sheet 115 is fed between the lower roll 102 and the recording sheet 104, as well as between the upper roll 101 and the sheet 104, and the pressure P is applied to both pressure rolls 101 and 102, thereby bonding the laminate sheet 115 to each side of the recording sheet 104. As regards other portions, the arrangement of FIG. 9 is substantially the same as the one shown in FIG. 8.

In the modification shown in FIG. 10, auxiliary sheets 117 are cut sheets of a suitable size, which are fed successively from a feeding mechanism 118 by means of a delivery roll 119. Naturally, this arrangement does not require any cutter. In this case, if each sheet 117 has a recording surface on each side thereof, another feed mechanism of the same construction may be disposed on the lower-roll side.

According to the fifth embodiment shown in FIG. 11, an auxiliary sheet 119, formed of a transparent laminate sheet having the shape of an elongate belt, is wound in a roll around a plastic pipe 120, which is fitted on the pressure roll 101. As the light- and pressure-sensitive recording sheet 104 moves, the auxiliary sheet 119 is paid out to be put on the recording surface of the sheet 104.

In this case, the auxiliary sheet 119 can be pasted securely on the recording surface of the recording sheet 104 by previously applying a bonding agent 122 to the sheet 119, by means of a coating roll 121, before the sheet 119 is put on the sheet 104.

The presence of the recording sheet 104 between the pressure rolls 101 and 102 is detected by a sheet sensor 123, whereby the delivery timing for the auxiliary sheet 119 can be controlled.

As in the arrangement of FIG. 8, the cutter 108 serves to cut the auxiliary sheet 119 and the recording sheet 104 into a predetermined size.

FIG. 12 shows the plastic pipe 120 and the auxiliary sheet 119 thereon, which are removed from the pressure roll 101. The pipe 120 facilitates the winding of the auxiliary sheet 119 around the pressure roll 101. In replacing the auxiliary sheet 119, moreover, the sheet 119 can be removed together with the pipe 120. Thus, the maintenance work is easier.

In this embodiment, if the recording sheet 104 has the recording sheet on each side thereof, it is necessary only that the auxiliary sheet 119 be wound in a roll also around the other pressure roll 102, in the same manner as aforesaid.

If a film having an ultraviolet-absorption effect is used in the aforementioned various arrangements employing the transparent laminate sheet, the recording surface of the recording sheet can be prevented from fading, despite an exposure to radiation, especially, ultraviolet rays.

Since the auxiliary sheet is interposed between the pressure roll and the recording surface of the light- and pressure-sensitive recording sheet, moreover, the pressurizing force of the pressure roll, on the microcapsules on the surface of the recording sheet, can be made uniform. This effect is distinguished particularly in the case of the embodiment of FIGS. 11 and 12 in which the auxiliary sheet is wound around the surface of the pressure roll.

According to the arrangements shown in FIGS. 7 to 12, the pressure roll mechanism includes a pair of pressure rolls, upper and lower. Alternatively, however, one of the pressure rolls may be replaced with any other suitable structure, e.g., a rigid conveyor belt. Thus, at least one pressure roll is required in effecting the present invention.

According to the present invention, moreover, if the image forming apparatus is applied to a copying machine or the like, light is transmitted through the original to serve for exposure If the apparatus is applied to a printer, however, image information is carried by light or radiation for exposure. The present invention may be applied suitably in either case.

It is to be understood that the present invention is not limited to the embodiments and modifications described above, and that various changes and other modifications may be effected therein by one skilled in the art without departing from the scope or spirit of the invention.

What is claimed is:

1. An image forming apparatus, comprising:
   a light-and-pressure-sensitive recording medium including a sheetlike substrate, a number of microcapsules provided on the surface of the substrate each containing a chromogenic material and a radiation-curable resin, and a developer material, said radiation-curable resin reacting with radiation, thereby increasing the mechanical rupture strength of the microcapsules, said developer material reacting with the chromogenic material;
   conveyer means for feeding the light-and-pressure-sensitive recording medium together with an original to an exposing position with the light-and-pressure-sensitive recording medium and the original overlapping each other;
   exposure means for applying radiation at the exposing position through the original to the light- and pressure-sensitive recording medium, said exposure means including a light source placed at the opposite side of said recording medium with respect of the original;
   separating means for separating the original from the light- and pressure-sensitive recording medium exposed by the exposure means; and pressurizing means for pressuring the light- and pressure-sensitive recording medium separated from the original so that the microcapsules, hardened by the exposure to the exposure means, and ruptured selectively in accordance with the mechanical ruptured strength thereof, thereby allowing chromogenic material and developer material to react with each other and change the color of the surface of the light-and pressure-sensitive recording medium.

2. The image forming apparatus according to claim 1, wherein said exposure means includes a rotatable drum formed of a light-transmitting material and containing the light source therein, said conveyer means feeding the original and the light- and pressure-sensitive recording medium onto the outer peripheral surface of the drum.

3. The image forming apparatus according to claim 2, which further comprises exit roll means for delivering the separated original to a first discharge slot, and wherein said separated recording medium is delivered to a second discharge slot, independent of the first discharge slot, via the pressurizing means.

4. An image forming apparatus, comprising:
a light- and pressure-sensitive recording medium including a sheetlike substrate, a number of microcapsules provided on the surface of the substrate each containing a chromogenic material and a photoplastic resin, and a developer material, said photoplastic resin reacting with radiation, thereby decreasing the mechanical rupture strength of the microcapsules, said developer material reacting with the chromogenic material;

conveyer means for feeding the light- and pressure-sensitive recording medium together with an original to an exposing position with the light- and pressure-sensitive recording medium and the original overlapping each other;

exposure means for applying radiating at the exposing position through the original to the light- and pressure-sensitive recording medium, said exposure means including a light source placed at the opposite side of said recording medium with respect to the original;

separating means for separating the original from the light- and pressure-sensitive recording medium exposed by the exposing means; and pressurizing means for pressuring the light- and pressure-sensitive recording medium separated from the original so that the microcapsules, softened by the exposure to the exposure-means, are ruptured selectively in accordance with the mechanical rupture strength thereof, thereby allowing chromogenic material and developer material to react with each other and change the color of the surface of the light- and pressure-sensitive recording medium.

* * * * *